United States Patent [19]

Ott et al.

[11] Patent Number: 4,800,001
[45] Date of Patent: Jan. 24, 1989

[54] METHOD AND APPARATUS FOR CONTINUOUSLY GALVANIZING FLAT WORKPIECES, AND ESPECIALLY PRINTED CIRCUIT BOARDS

[75] Inventors: Rudi Ott, Sachsenheim; Heribert Reith, Stuttgart, both of Fed. Rep. of Germany

[73] Assignee: Robert Bosch GmbH, Stuttgart, Fed. Rep. of Germany

[21] Appl. No.: 8,738

[22] Filed: Jan. 30, 1987

[30] Foreign Application Priority Data

Feb. 7, 1986 [DE] Fed. Rep. of Germany ....... 3603856

[51] Int. Cl.$^4$ .................. C25D 7/00; C25D 17/12; C25D 17/28
[52] U.S. Cl. ........................ 204/15; 204/24; 204/27; 204/198; 204/224 R; 204/267; 204/275
[58] Field of Search ............ 204/27, 15, 24, 206–211, 204/198, 224 R, 212, 267, 275

[56] References Cited

U.S. PATENT DOCUMENTS

| | | | |
|---|---|---|---|
| 936,472 | 10/1909 | Pfanhauser | 204/206 |
| 4,402,799 | 9/1983 | Ash et al. | 204/15 |
| 4,569,730 | 2/1986 | Killer | 204/24 |

*Primary Examiner*—John F. Niebling
*Assistant Examiner*—William T. Leader
*Attorney, Agent, or Firm*—Frishauf, Holtz, Goodman & Woodward

[57] ABSTRACT

Printed circuit boards can be continuously electroplated by passing them through a pair of rollers (7) forming cathodic rollers, which are spring-pressed towards each other, the rollers being driven, for example at the circumferential speed of about ½ meter per minute. The rollers form a transport arrangement for the printed circuit board, while providing electrical connection to conductive tracks thereon. Closely downstream of the cathodic rollers are a pair of anodic rollers, made, for example, of titanium with a covering of platinum or iridium, over which a felt sleeve is placed, on which felt sleeve an electrolyte, including sulfuric acid and copper is sprayed. The anodic rollers, connected to a positive terminal, are spaced from the surface of the printed circuit board to leave a surface gap between the rollers and the printed circuit board of about 0.1 mm. Copper is electrolytically deposited, for example, at the current density of about 15 A/dm$^2$, which is about six times of the density of immersion bath galvanizing, thus permitting deposition of about 32 micrometers copper in 10 minutes rather than 60 minutes in an immersion bath. A plurality of cathodic roller pairs (7) and anodic roller pairs (8) are combined in a single housing to form a module, for example of 10 pairs each, requiring for ten modules 7 meters of length of plane floor space for continuous processing.

17 Claims, 2 Drawing Sheets

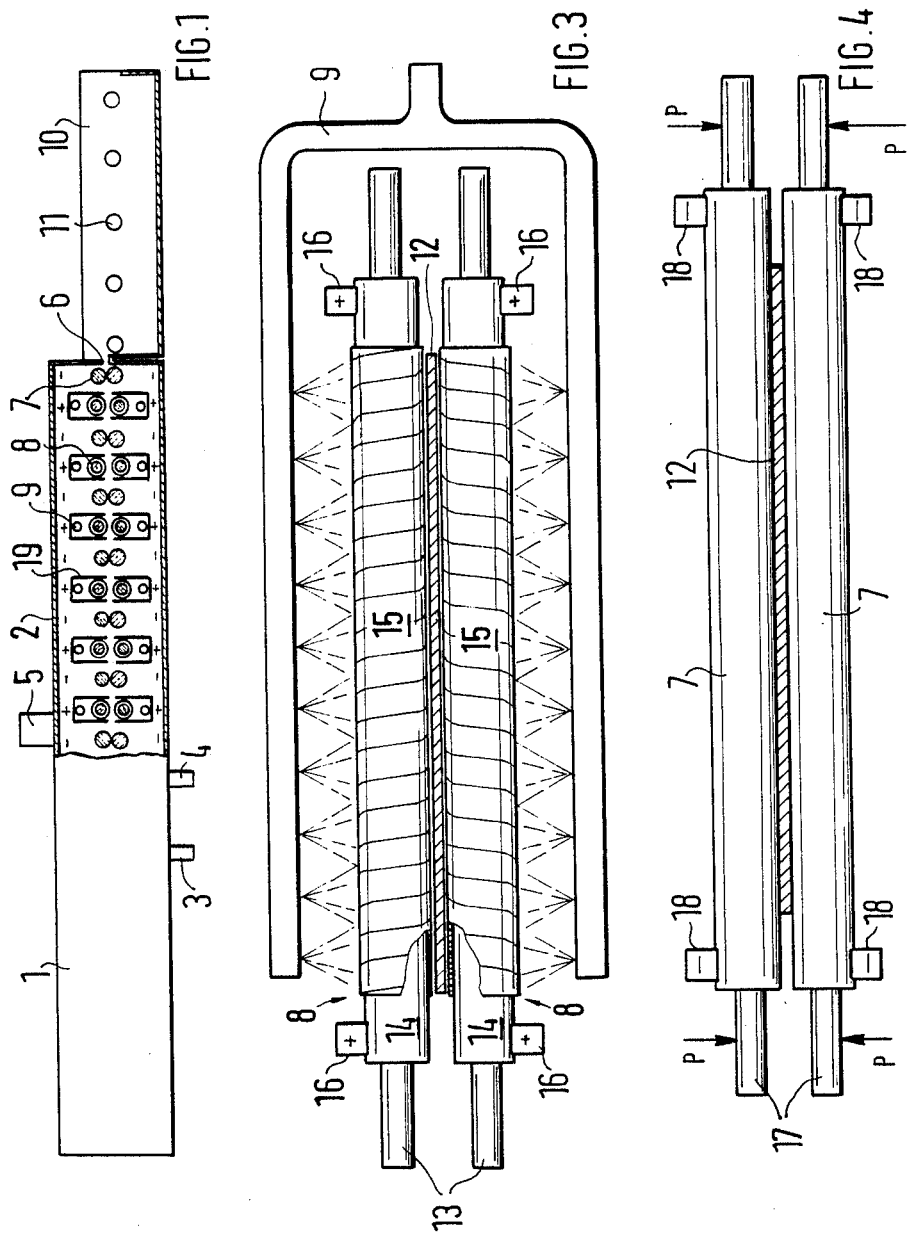

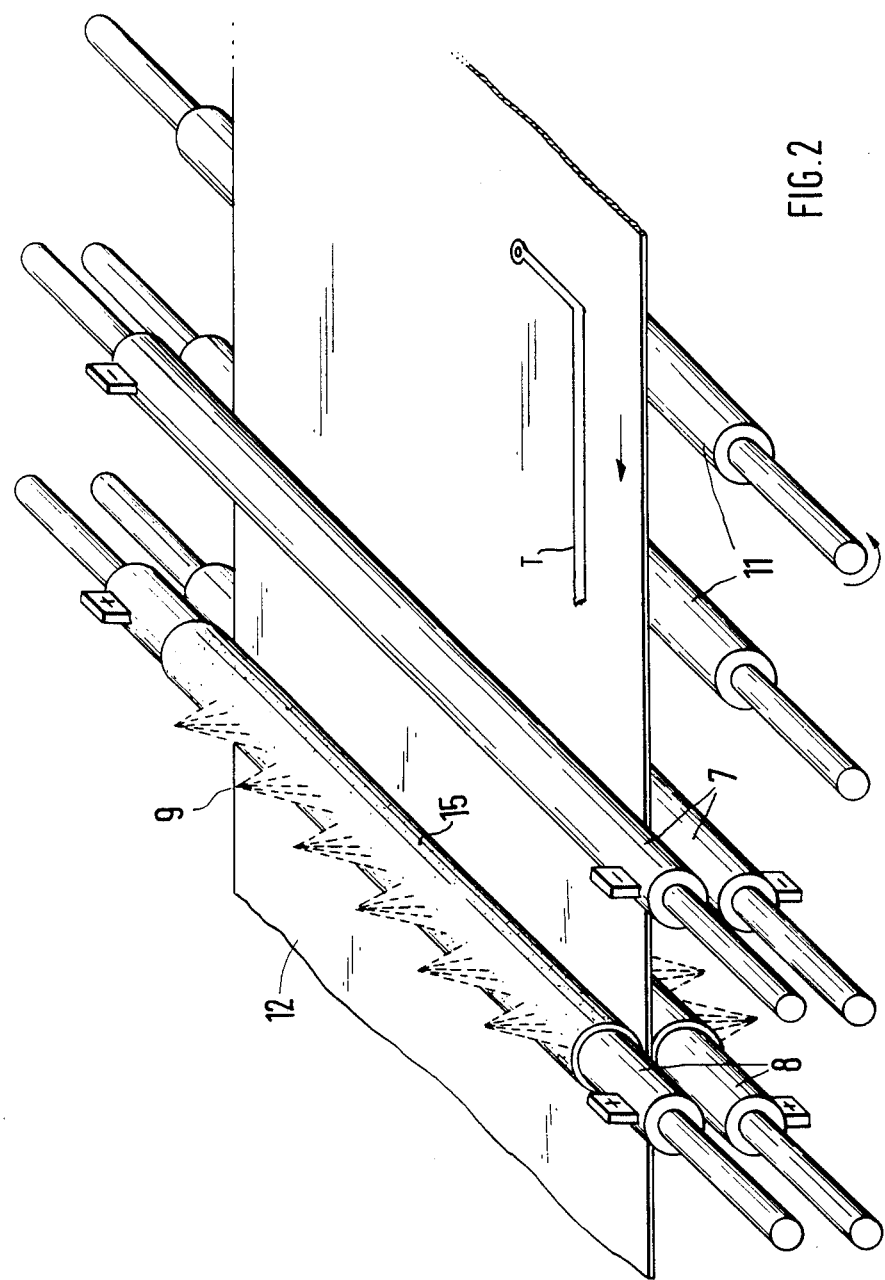

METHOD AND APPARATUS FOR CONTINUOUSLY GALVANIZING FLAT WORKPIECES, AND ESPECIALLY PRINTED CIRCUIT BOARDS

The present invention relates to a method and apparatus for galvanizing flat workpieces having an electrically conductive surface portion, for example printed circuit boards.

BACKGROUND

Various apparatus are used to galvanize electrically conductive materials on surfaces of workpieces, for example printed circuit boards. To galvanize printed circuit boards, electrically conductive surfaces are applied to an insulating substrate. Frequently, it is desirable to increase the thickness of the electrically conductive surfaces to provide thicker conductive tracks. Conventional apparatus for galvanizing printed circuit boards (PCBs) utilize immersion baths, in which the PCBs are secured to carriers or frames and then immersed, longitudinally, in the respective processing bath. The processing is by batches. In processing by immersion, for example by insertion vertically into a bath tub or vessel, the relative movement between electrolyte and the substrates or workpieces is small, so that comparatively long exposure times are required. For example, in order to deposit a layer of 30 micrometers of copper on a conductive track, utilizing the customary current density of about 2.5 A/dm$^2$, requires about one hour. The method is in batches, that is, non-continuous. It is, therefore, comparatively difficult to introduce such a galvanizing bath step into a continuous production process. The thickness of the resulting copper layer is not always satisfactory, and reproducible results in such an immersion bath galvanizing process are difficult to obtain.

THE INVENTION

It is an object to provide a method and an apparatus to permit continuous galvanizing of flat workpieces, particularly printed circuit boards, which is rapid, reliable, and results in reproducible deposition thicknesses. Specifically, it is an object to provide a method and apparatus for continuously galvanizing printed circuit boards which can be matched to production line requirements, and requires less electrolyte than heretofore and, additionally, can be used with automatic production machinery.

Briefly, the flat workpieces, typically printed circuit boards, are passed in surface engagement in a nip between a pair of rotating cathodically connected rollers. The rollers grip the PCB and, preferably, also form the transport device therefor through the apparatus. The rollers are connected to a negative terminal of a current source. Downstream of the rollers, the PCBs, still being transported by the cathodic rollers, are passed with slight clearance between a pair of rotating anodically connecting rollers which have a surface capable of accepting an electrolyte liquid, for example being sprayed thereon. The surface may be a felt surface. The surface transfers electrolyte from the anodic rollers to the workpiece for electro-chemical deposition or on the electrically conductive material on the workpiece, typically conductive tracks.

The method and apparatus has the advantage that large area flat workpieces can be covered by galvanic deposition at a speed which is faster by at least a factor of 6 with respect to a bath and immersion process. The apparatus and system can be used especially advantageously for galvanic reinforcement of conductive tracks by depositing copper thereon, with passthrough times which are comparatively short. The distribution of the additional thickness being formed is quite uniform, even, and reproducible. The quantity of electrolyte required is less than before and both feed of the PCBs, that is, supply to the apparatus, as well as removal from the apparatus, can be entirely automatic, so that the method and structure is particularly suitable for combination with automatic production machinery.

When galvanically enhancing the thickness of conductive tracks on PCBs of substantial size, which are the ones usually handled, it is advantageous to assemble a plurality of sequentially cathodically and anodically connected roller pairs in serial sequence. The roller pairs can be located close to each other. A region in which up to 100 pairs of anodes are used can be easily obtained. If such a large number of anode pairs is required, a modular arrangement is preferable.

In accordance with a feature of the invention, the apparatus is constructed in various modules of about 10 pairs of sequentially arranged cathodic and anodic rollers which are combined in a single production module, with as many modules being used or connected as is required to obtain the necessary thickness of electrochemically deposited material on the conductive tracks of the PCBs. The modular construction permits matching to changes in production requirements, or production capacity. The modular construction, further, permits easy change-over of the arrangement, and interconnection with other continuous processes and treatment structures, for example for pickling, cleaning, scouring, rinsing, or the like.

In accordance with a preferred feature of the invention, the anodically connected roller pairs, formed with a surface which can accept accept liquids, receive the required electrolyte over a spray arrangement, for example a spray pipe or spray manifold; plastic shields or shrouds are used to separate the cathodic rollers from the anodic rollers and to prevent splashing of electrolyte on the cathode rollers.

DRAWINGS

FIG. 1 is a highly schematic part cross-sectional view through an apparatus of a galvanizing module constructed in accordance with the present invention;

FIG. 2 is a part-perspective illustration of the interior of such a module, with parts omitted to facilitate illustration;

FIG. 3 is a longitudinal view, taken in the direction of movement of a workpiece between anodically connected rollers, and illustrating supply of electrolyte; and FIG. 4 is a view similar to FIG. 3, illustrating the cathodically rollers and transport of the workpiece.

DETAILED DESCRIPTION

A galvanizing module 1 - see FIG. 1 - is formed by a container or vessel 2 having an electrolyte supply connection 3, an electrolyte drain connection 4, and a vacuum or exhaust stub 5. The vessel or container 2 receives a plurality of rollers, which are located in vertical pairs and serially arranged. The vessel 2 is formed with a transversely extending inlet gap 6 to receive a workpiece, in the form of a flat plate, typically a printed circuit board (PCB) having electrically conductive material in the form of conductive tracks T thereon. A pair of cathodically connected rollers 7 is located immediately adjacent the inlet gap 6. These rollers 7 are, for short, referred to as cathodic rollers. The next roller pair is anodically connected rollers 8, for short anodic rollers; the anodic rollers are again followed by cathodic rollers 7, then anodic rollers 8, and so on. The spacing between a cathodic roller pair 7 and an anodic roller pair 8 may be about 5 cm. Ten to twelve pairs of anodic rollers 8 and a similar pair of cathodic rollers 7 are located within any galvanizing module 1. At the final exit end of a module 1, a gap similar to gap 6 is formed which carries another pair of cathodic rollers 7 immediately adjacent the exit gap (not shown).

An electrolyte supply apparatus 9, in the form of a spray pipe or manifold (see FIG. 3) is located above and below the respective anodic rollers 8. The spray manifold 9 and the anodic rollers 8 are shielded and separated from the cathodic rollers by a shielding hood 19. The shielding hood 19 reaches up to and close to the workpiece, with only slight clearance therefrom as shown in FIG. 1.

A board supply module 10 is located in advance of the first galvanizing module 1. The supply module 10 may include a roller transport arrangement, formed by rollers 11, at least some of which are driven. FIG. 2 illustrates the arrangement, in perspective form. The spray manifold 9, and the housing, container or vessel 2, as well as the inlet gap 6 have been omitted from FIG. 2 for better illustration.

FIG. 2 shows a workpiece, in the form of a PCB 12, being transported by the transport rollers 11 and then gripped between the cathodic rollers 7. Cathodic rollers 7 are spring-loaded, to tightly engage the PCB 12. The two rollers press, with force, against each other and grip the PCB 12,thereby providing at the same time cathodic electrical connection to the conductive tracks on the PCB 12. In the illustration of FIG. 2, the PCB travels from the right towards the left. The PCB 12, after leaving the cathodic roller 7, is then carried between the anodic rollers 8. The anodic rollers 8 are journalled in such a manner that there is a slight gap between the PCB 12 being fed to the anodic rollers 8 and the rollers themselves. The rollers 8 receive electrolyte from the spray manifold 9—not shown in FIG. 8. The sequence of cathodic rollers 7 tightly engaging the PCB—anodic rollers 8, receiving the PCB with slight clearance—further cathodic rollers 7 tightly engaged in the PCB . . . etc., continues throughout the module 1, as schematically illustrated in FIG. 1.

The anodic rollers and the arrangement in connection with the electrolyte spray is best seen in FIG. 3. A pair of anodic rollers 38 have a spray manifold pipe 9 associated therewith, surrounding the anodic roller in U-shaped form, as seen in FIG. 3. The anodic rollers 8 include shafts 13, suitably journalled in bearings, not shown. Preferably, the drive of the lower roller is effected on the left side —with respect to FIG. 3—of the lower roller 8, and the drive of the upper roller on the right side thereof.

The rollers are formed by jackets 14 of titanium, the surface of which is coated with a coating of platinum or iridium. The jacket 14, coated with platinum, or iridium, respectively, has an acid-resistant felt sleeve 15 slipped thereover in the region of the conductive track 12. The felt sleeve or felt fabric 15 receives the electrolyte 9, sprayed thereon. Electrical connection to the anodic roller is effected by sliprings and brushes, schematically shown at 16, in accordance with any well-known and suitable rotary-to-stationary electrical connection.

In accordance with a feature of the invention, the anodic rollers are so spaced from each other that a gap of about 0.1 mm will result between the respective upper and lower surface of the PCB 12 and the surface of the felt sleeve on the respective upper and lower rollers 8. Preferably, the bearings are so arranged, for example by being eccentrically positioned in a support wall, that the spacing of the two rollers 8 can be adjusted, so that the spacing can be matched to the thickness of the PCB being fed between the rollers 8, leaving, in all instances, a gap of about 0.1 mm between the respective upper and lower surfaces of the PCB between the rollers 8 and the surface of the felt sleeve or cover on the rollers 8.

The cathodic rollers 7 have extending shafts 17, retained in suitable bearings, not shown. The lower roller is driven on the right side, and a gear connection at the left side couples the lower and the upper rollers together. The cathode rollers 7 are formed with a jacket of stainless high-quality steel, or titanium. Connection to the cathode terminal of a current supply is effected by sliprings or brush terminals 18, constructed in any suitable and well-known manner. The cathode rollers 7 of any roller pair are pressed against each other by substantial force. Preferably, the bearings for the shaft 17 are resiliently supported by springs pressing against each other. This ensures reliable gripping of the PCB 12 being fed between the nip formed by the rollers 7, reliable electrical engagement with the electrically conductive tracks or surface portions thereon and reliable further transport of the PCB through the subsequent gap between the anodic rollers 8. The resilient force engagement of the two rollers 7 is schematically illustrated by the force arrows P, acting on the shaft ends or stubs 17, but omitted from other drawings for clarity.

Example

A printed circuit board 12 is passed between cathode rollers 7 and anode rollers 8. The anode rollers 8, including the felt sleeve 15, each, have a diameter of 2 cm. The spacing of a pair of cathodic rollers 7 and a pair of anodic rollers 8 is 5 cm.

Current being applied for 10 cm axial length of anode is 7.5 A; electrolyte circulation per 10 cm axial length of the anode is 50 liters/hour. Pass-through speed of the PCB 12 is about ½ meter per minute. The diameter of the cathode rollers is also 2 cm, so that, at the pass-through speed of ½ meter per minute, the cathode rollers operate at 8 rpm.

The anode rollers operate at much higher speed, in the example 150 rpm. The movement of electrolyte can be controlled to some extent by changing the speed of the anode rollers, and matched to the position requirements.

A suitable electrolyte, used in the example, is sulfuric acid copper electrolyte, without surface-active or surfactant additives or brightener additives; a typical suitable composition is 40 grams per liter copper and 250 grams per liter sulfuric acid, $H_2SO_4$.

The current density resulting in the above example is about 15 $A/dm^2$; that is about six times the value of customary immersion bath galvanizing current density. As a result, 32 micrometers copper can be deposited in only ten minutes, rather thn in 60 minutes exposure time in an immersion bath.

The PCB used had a width of ½ meter; for a pass-through speed of ½ meter per minute, a throughput of about 15 meter 2 per hour is obtained, with a deposition of about 30 micrometers copper. All parameters being equal, and as above referred to, 100 pairs of anodic-cathodic roller pairs are needed, that is, in a typical example, 10 serially connected modules of 10 pairs of anodic rollers, and 11 pairs of cathodic rollers 7, that is, one extra pair of cathodic rollers at the exit gap of the respective modules. Theoretically, space requirement would be 5 meters length if a single structure is used; as noted above, use of modula arrangement is, however preferred, and if the structure is built up of individual galvanizing modules, each one having 10 anodic roller pairs and 11 cathodic roller pairs, 10 serially connected galvanizing modules require, for 100 anodic roller pairs, about 7 meters of production line length.

Construction of an overall production line in the form of single modules has the advantage that the arrangement of the entire plan is highly variable and can be changed to meet requirements; the number of the required modules can be readily changed in dependence on required thickness of the deposited layer, width of the PCBs, and the like.

The structure and method, of course, is to be used with all the other well-known and standard auxiliaries in connection with electro-galvanic deposition of metal; that is, the electrolyte is to be monitored, its composition checked, and generated. The loss of copper in the electrolyte is to be suitably replaced, and the pH value is to be monitored for constant pH condition all as is well-known in connection with electro-chemical deposition of metal Such well-known and standard monitoring, checking and control systems and arrangements are not shown or specifically discussed because they can be in accordance with any well-known structure and arrangement, as used, for example, with immersion baths.

Various changes and modifications may be made. For example, and typically for use with PCBs, the speed of the anodic rollers should be between 10 to 20 times that of the cathodic rollers. Diameters of between 15 to 25 mm (about 0.6 to 1 inch) for the cathodic rollers, and for the anodic rollers, including the liquid accepting cover, are suitable, the respective cathodic and anodic roller pairs being spaced from each other by between about 4 to 6 cm, preferably separated by plastic subdivisions, covers, shields or hoods to prevent sPray of electrolyte on the cathodic rollers. The hoods preferably reach up to close to the workpiece to provide for effective separation The mutual roller spacing is measured on a center-to-center position of the respective shafts 13 and 17 of the rollers 7 and 8.

When the PCB has been gripped between the first cathodic rollers 7, it is extended cantilever fashion, between the neighboring anodic rollers 8. Thereafter, the PCB is supported in bridge-like manner by the cathodic rollers 7 while being passed between the anodic rollers 8.

We claim:

1. Method of continuously galvanizing flat workpieces (12) each including electrically conductive material on at least a portion of the surface thereof,
   comprising the steps of
   feeding the flat workpieces in a nip formed between a pair of rotating rollers (7) having an electrically conductive surface, and being connected to a cathode terminal of an electrical source, and forming cathodic rollers;
   then, downstream of said cathodic rollers (7), passing said workpieces between a pair of rotating rollers (8) connected to an anode terminal of the electrical source, and forming anodic rollers,
   said anodic rollers having a surface (15) capable of accepting and carrying an electrolyte liquid, the surfaces of said anodic rollers being spaced slightly from the workpiece,
   providing a spray hood (19) around said anodic rollers (8), said hood extending close to the surface of the workpiece (12) to prevent spraying of electrolyte onto the cathodic rollers, and spraying electrolyte within said hood (19) onto said electrolyte-accepting surface (15) of said anodic rollers, and
   transferring electrolyte from said anodic rollers (8) to the workpieces (12) for electrochemical deposition of metal on the electrically conductive material of the workpiece in the gap between the surface of the workpiece and the surface of the anodic rollers while electrical current is being transferred to said electrically conductive material by continued engagement of said electrically conductive material with the cathodic rollers adjacent the anodic rollers.

2. The method of claim 1, wherein the cathodic rollers (7) are driven, and the surfaces of the cathodic rollers are in surface engagement with the workpiece (12) to effect, simultaneously, electrical contact of the electrically conductive material on the workpiece (12) and transport of the workpiece through the cathodic rollers, as well as between the anodic rollers.

3. The method of claim 1, wherein the cathodic rollers are driven at a predetermined linear circumferential speed;
   and wherein the anodic rollers (8) are driven at a linear circumferential speed which is between 10 to 20 times the predetermined linear circumferential speed of the cathodic rollers.

4. The method of claim 1, wherein the workpieces (12) are transported between the anodic rollers (8) at a predetermined linear speed;
   and wherein the circumferential linear speed of the anodic rollers (8) is between 10 to 20 times the linear speed of the workpiece being passed between the anodic rollers with said slight spacing.

5. The method of claim 1, wherein the surfaces of the anodic rollers (8) are, respectively, spaced from the surfaces of the workpiece by a gap of about 0.1 mm.

6. The method of claim 1, wherein the spacing of at least one of the surfaces from the surface of a facing anodic roller (8) is in the order of about 0.1 mm.

7. The method of claim 1, including the step of passing the workpiece through a sequence of alternately positioned pairs of cathodic rollers (7) and anodic rollers (8).

8. The method of claim 1, wherein a plurality of pairs of cathodic rollers (7) and anodic rollers (8) are combined to form a module;
   and wherein said steps of feeding the workpiece to the cathodic rollers (7) and passing the workpiece to the anodic rollers (8) comprises feeding the workpiece to a module, in which at least the initial pair of rollers is formed by a pair of cathodic rollers (7).

9. The method of electroplating flat workpieces, as claimed in claim 1 wherein said workpieces are the printed circuit boards, and said electrically conductive material comprises electric tracks;

and wherein the electrolyte being transferred from the anodic rollers to the conductive tracks includes copper.

10. Apparatus for continously galvanizing flat workpiece (12) including elecrically conductive material (T) on portions of their surfaces by passing the workpieces sequentially through pairs of cathodic and anodic rollers comprising a pair of opposed rotating rollers (7) connected to a cathode terminal of an electric source, and forming cathodic rollers;

a further pair of opposed rollers (8) connected to an anode terminal of the electrical source, and forming anodic rollers (8), said cathodic rollers having a metallic surface;

means (P) resiliently pressing the cathodic rollers towards each other;

a surface cover (15) on each of the rollers of the anodic roller pair (8) which is capable of receiving an electrolyte liquid, the anodic rollers being spaced from each other by a distance such that the flat workpieces (12) can pass between the surfaces of the liquid-receiving covers with slight clearance;

means (9) for spraying electrolyte onto said electrolyte liquid-receiving covers (15) of the anodic roller pairs;

and a spray hood (19) surrounding the anodic rollers (8) and separating the anodic rollers from the cathodic rollers to prevent spraying of electrolyte on the cathodic roller, said spray hood reaching up close to the position of the workpiece (12) between the anodic rollers.

11. The apparatus of claim 10, wherein the cathodic rollers (7) comprise high-quality stainless steel or titanium.

12. The apparatus of claim 10, wherein the anodic rollers comprise titanium, a coating of platinum or iridium on the titanium of the anodic rollers;

and wherein said electrolyte-liquid-receiving cover comprises an acid-resistant cover sleeve or wrap.

13. The apparatus of claim 12, wherein said cover sleeve or wrap comprises felt.

14. The apparatus of claim 10, wherein the anodic rollers (8) and the cathodic rollers (7), each, have a diameter of between 1.5 to 2.5 cm;

and wherein the spacing of the anodic roller pairs (8) and the cathodic roller pairs, from each other, is between about 4 to 6 cm.

15. The apparatus of claim 10, wherein the spacing of the surface of a roller of the anodic rollers from the facing surface of the workpiece is adapted to be on the order of about 0.1 mm.

16. The apparatus of claim 10, further including a common housing or container (2) retaining a plurality of pairs of cathodic rollers (7) and anodic rollers, located adjacent each other, and forming a galvanizing module, said module including an entrance gap (6) formed in the housing or container;

and wherein a pair of cathodic rollers (7) is located within said housing or container immediately inwardly of said gap, said cathodic rollers being adapted to be driven at a transport speed for transporting the workpiece between the cathodic rollers and into the module and in the gap between subsequent anodic rollers:

and wherein the anodic rollers are driven at adapted to be surface speed of from 10 to 20 times the surface speed of travel of the workpiece between the anodic rollers.

17. The apparatus of claim 10 the electrolyte includes copper.

* * * * *